(12) United States Patent  (10) Patent No.: US 9,607,914 B2
Gwin  (45) Date of Patent: Mar. 28, 2017

(54) MOLDED COMPOSITE ENCLOSURE FOR INTEGRATED CIRCUIT ASSEMBLY

(71) Applicant: Intel Corporation, Santa Clara, CA (US)

(72) Inventor: Paul J. Gwin, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 14/434,239

(22) PCT Filed: May 15, 2014

(86) PCT No.: PCT/US2014/038273
§ 371 (c)(1),
(2) Date: Apr. 8, 2015

(87) PCT Pub. No.: WO2015/174993
PCT Pub. Date: Nov. 19, 2015

(65) Prior Publication Data
US 2016/0268178 A1   Sep. 15, 2016

(51) Int. Cl.
*H01L 23/053*   (2006.01)
*H01L 23/04*   (2006.01)
(Continued)

(52) U.S. Cl.
CPC .............. *H01L 23/053* (2013.01); *G06F 1/18* (2013.01); *H01L 21/4803* (2013.01);
(Continued)

(58) Field of Classification Search
CPC ......... H01L 23/06; H01L 23/08; H01L 24/17; H01L 24/81
(Continued)

(56) References Cited

U.S. PATENT DOCUMENTS 5,550,403 A * 8/1996 Carichner ............. H01L 23/057
257/697
6,275,381 B1 * 8/2001 Edwards ............ H05K 7/20454
165/185
(Continued)

FOREIGN PATENT DOCUMENTS

JP   2011-134138 A   7/2011
KR   10-2014-0004864 A   1/2014
(Continued)

OTHER PUBLICATIONS

International Search Report and Written Opinion mailed Jan. 28, 2015, issued in corresponding International Application No. PCT/US2014/038273, filed May 15, 2014, 9 pages.
Search Report issued Mar. 16, 2016 for Taiwan Application No. 104111614, 2 pages.

*Primary Examiner* — Nitin Parekh
(74) *Attorney, Agent, or Firm* — Schwabe, Williamson & Wyatt, P.C.

(57) ABSTRACT

Embodiments of the present disclosure are directed toward a molded composite enclosure for an integrated circuit (IC) assembly. In one embodiment, an enclosure for an integrated circuit (IC) assembly may include a molded lid structure having a body portion, and a side portion that extends from the body portion and forms a cavity configured to house the IC assembly, wherein the body portion and the side portion share a contiguous interior material comprising a polymer and share a contiguous exterior material comprising a metal, the contiguous interior material having an opening formed in the body portion such that the IC assembly can be thermally coupled with the contiguous exterior material through the opening. Other embodiments may be described and/or claimed.

12 Claims, 4 Drawing Sheets

(51) Int. Cl.
*H01L 23/06* (2006.01)
*G06F 1/18* (2006.01)
*H01L 21/48* (2006.01)
*H01L 21/50* (2006.01)
*H01L 21/56* (2006.01)
*H01L 23/08* (2006.01)
*H01L 23/31* (2006.01)
*H01L 23/00* (2006.01)

(52) U.S. Cl.
CPC .......... *H01L 21/4817* (2013.01); *H01L 21/50* (2013.01); *H01L 21/565* (2013.01); *H01L 23/04* (2013.01); *H01L 23/06* (2013.01); *H01L 23/08* (2013.01); *H01L 23/3142* (2013.01); *H01L 24/17* (2013.01); *H01L 24/81* (2013.01); *H01L 2224/16113* (2013.01); *H01L 2224/16225* (2013.01); *H01L 2224/32225* (2013.01); *H01L 2224/73204* (2013.01); *H01L 2924/01012* (2013.01); *H01L 2924/01013* (2013.01); *H01L 2924/01022* (2013.01); *H01L 2924/01026* (2013.01); *H01L 2924/01028* (2013.01); *H01L 2924/0133* (2013.01); *H01L 2924/06* (2013.01); *H01L 2924/065* (2013.01); *H01L 2924/068* (2013.01); *H01L 2924/069* (2013.01); *H01L 2924/0615* (2013.01); *H01L 2924/0635* (2013.01); *H01L 2924/0695* (2013.01); *H01L 2924/0705* (2013.01); *H01L 2924/10253* (2013.01); *H01L 2924/1438* (2013.01); *H01L 2924/1443* (2013.01); *H01L 2924/15153* (2013.01); *H01L 2924/16152* (2013.01); *H01L 2924/19105* (2013.01)

(58) Field of Classification Search
USPC ........................................ 257/704, 713, 778
See application file for complete search history.

(56) References Cited

U.S. PATENT DOCUMENTS

| | | | | |
|---|---|---|---|---|
| 7,221,571 | B2* | 5/2007 | Kubo | H01L 23/3675 257/712 |
| 7,304,381 | B2* | 12/2007 | Rumer | H01L 23/40 257/257 |
| 7,586,180 | B2* | 9/2009 | Hata | H01L 23/49562 257/276 |
| 7,851,906 | B2* | 12/2010 | Alcoe | H01L 23/10 257/706 |
| 7,989,947 | B2* | 8/2011 | Otani | H01L 21/565 257/706 |
| 8,018,072 | B1* | 9/2011 | Miks | H01L 23/4334 257/667 |
| 8,896,113 | B2* | 11/2014 | Miyake | H01L 23/02 257/687 |
| 2002/0079613 | A1 | 6/2002 | Benefield | |
| 2010/0232124 | A1 | 9/2010 | Bang et al. | |
| 2012/0067871 | A1* | 3/2012 | Sherrer | C23C 24/082 219/678 |
| 2012/0205801 | A1* | 8/2012 | Bindrup | H01L 23/57 257/738 |
| 2014/0036435 | A1 | 2/2014 | Kim | |
| 2014/0077352 | A1* | 3/2014 | Leal | H01L 24/32 257/704 |
| 2015/0145116 | A1* | 5/2015 | Uzoh | H01L 24/10 257/712 |
| 2015/0279828 | A1* | 10/2015 | Koopmans | H01L 25/18 257/713 |

FOREIGN PATENT DOCUMENTS

TW  M468135 U  12/2013
TW  201407330 A  2/2014

* cited by examiner

MOLDED COMPOSITE ENCLOSURE FOR INTEGRATED CIRCUIT ASSEMBLY

CROSS REFERENCE TO RELATED APPLICATION

The present application is a national phase entry under 35 U.S.C. §371 of International Application No. PCT/US2014/038273, filed May 15, 2014, entitled "MOLDED COMPOSITE ENCLOSURE FOR INTEGRATED CIRCUIT ASSEMBLY," which designates, among the various States, the United States of America. The entire content and disclosure of International Application No. PCT/US2014/038273 is hereby incorporated by reference in its entirety for all purposes.

FIELD

Embodiments of the present disclosure generally relate to the field of integrated circuits, and more particularly, to a molded composite enclosure for an integrated circuit (IC) assembly.

BACKGROUND

Currently, enclosures for electronic assemblies such as, for example, solid-state drives (SSDs) may include cast metal structures. However, cast metal structures may be costly to manufacture, may have relatively higher mass or lower stiffness, may require cosmetic finishing, and/or may not allow integration of fastening features such as screwless designs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe a molded composite enclosure for an integrated circuit (IC) assembly. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, thermal or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

Figure 1:
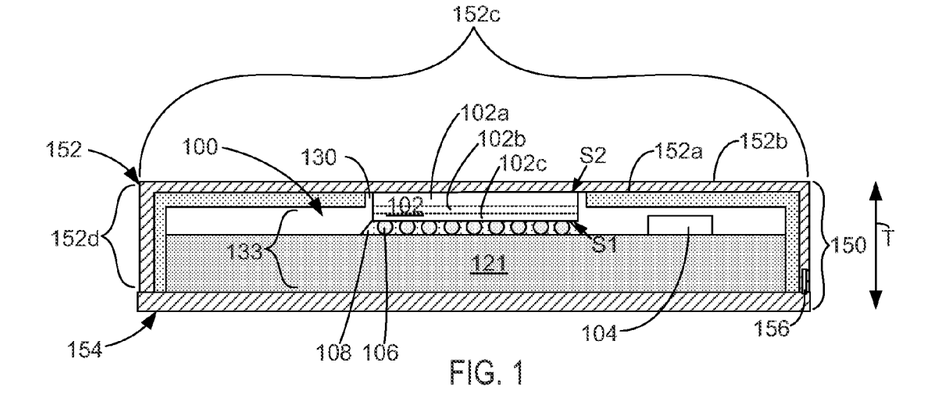
FIG. 1 schematically illustrates a cross-section side view of an example enclosure for an integrated circuit (IC) assembly, in accordance with some embodiments.

FIG. 1 schematically illustrates a cross-section side view of an example enclosure 150 for an integrated circuit (IC) assembly 100, in accordance with some embodiments. According to various embodiments, the enclosure 150 includes a lid portion 152 and a base portion 154. The lid portion 152 and the base portion 154 may be coupled together to house an IC assembly 100. Components of the enclosure 150 and IC assembly 100 may not be drawn to scale.

According to various embodiments, the lid portion 152 (e.g., lid structure) may include a molded, composite structure. For example, in some embodiments, the lid portion 152 may include an interior portion 152a composed of a polymer and an exterior portion 152b composed of a metal. The interior portion 152a and the exterior portion 152b may be shaped (e.g., molded) to provide a body portion 152c and a side portion 152d. As can be seen, the body portion 152c may extend to cover the IC assembly 100 and the side portion 152d may extend from the body portion 152c to form a cavity 133 that houses the IC assembly 100.

The interior portion 152a and the exterior portion 152b may each be a contiguous material structure shaped by a molding process. For example, the interior portion 152a may include a single, continuous material structure comprising polymer and the exterior portion 152b may include a single, continuous material structure comprising metal. The body portion 152c and the side portion 152d may share the interior portion 152a and the exterior portion 152b. In this regard, the body portion 152c and the side portion 152d may share a contiguous interior material of polymer and a contiguous exterior material of metal.

According to various embodiments, the contiguous interior material (e.g., the interior portion 152a) may have an opening 130 formed in the body portion 152c. The IC assembly 100 may include heat-generating elements (e.g., die 102) that are thermally coupled with the contiguous exterior material (e.g., the exterior portion 152b) through the opening 130, as can be seen. Although a single opening 130 is depicted in the embodiment of FIG. 1, in other embodiments multiple openings similar to the opening 130 may be formed through the interior portion 152a to allow other heat-generating elements of an IC assembly or other power dissipating device to be thermally coupled with the exterior portion 152b through respective openings of the multiple openings. The heat-generating elements of the IC assembly 100 may include a wide variety of devices including, for example, circuitry of one or more dies (e.g., die 102). In some embodiments, the IC assembly 100 may be thermally coupled with the metal of the exterior portion 152b using a thermal interface material such as, for example, phase change, thermal grease, conductive thermoplastic or thermoset and/or adhesive material, adhesive. The exterior portion 152b may be composed of metal that serves as a heat sink or thermal pathway away from the IC assembly 100.

In some embodiments, the interior portion 152a may be composed of a polymer such as, for example, ABS (Acrylonitrile Butadiene Styrene), ABS+PC (ABS+Polycarbonate), Acetal (POM), Acrylic (PMMA), LCP (Liquid Crystal Polymer), PA-Nylon 6 (Polyamide), PA-Nylon 6/6 (Polyamide), PA-Nylon 11 (Polyamide), PBT (Polybutylene Terepthalate), PC (Polycarbonate), PEI (Polyetherimide), PE (Polyethylene), LDPE (Low Density Polyethylene), HDPE (High Density Polyethylene), PET (Polyethylene Terephthalate), PP (Polypropylene), PPA (Polyphthalamide), PPS (Polyphenylene Sulfide), PS (Polystyrene), HIPS (High Impact Polystyrene), PSU (Polysulfone), PU (Polyurethane), PVC (Polyvinylchloride), PVDF (Polyvinylidene Fluoride), SAN (Styrene Acrylonitrile), TPE (Thermoplastic Elastomer) or TPU (Thermoplastic Polyurethane). In some embodiments, the exterior portion 152b may be composed of a metal such as, for example, aluminum (Al), iron (Fe), titanium (Ti), copper (Cu), nickel (Ni), magnesium (Mg), stainless steel, Inconel, or suitable combinations of various metals in alloy form. The metal may be clad (e.g., two metals diffusion bonded together) or not clad according to various embodiments. The interior portion 152a and the exterior portion 152b may be composed of other suitable materials in other embodiments. In some embodiments, a primer material (e.g., primer material 152e of FIG. 4) may be disposed between the interior portion 152a and the exterior portion 152b to promote adhesion between the interior portion 152a and the exterior portion 152b. Techniques and configurations for the primer material are described further in connection with FIG. 4.

The enclosure 150 may further include a base portion 154 (e.g., base structure) coupled with the lid portion 152. In some embodiments, the base portion 154 may include a substantially flat structure that is configured to couple with the side portion 152d of the lid portion 152. When the base portion 154 is coupled with the lid portion 152, the cavity 133 may provide space to house the IC assembly 100. In some embodiments, the base portion 154 may be attached (e.g., permanently or removably coupled) with the lid portion 152 using one or more fastening mechanisms 156 (e.g., snap structures) that may be integrally formed as part of a molding process to provide screwless attachment. The base portion 154 and the lid portion 152 may be coupled together using other fastening mechanisms such as, for example, joints formed by ultrasonic welding in other embodiments. The enclosure 150 may be hermetically or environmentally sealed in some embodiments to provide protection of the IC assembly 100 from environmental factors or handling. For example, in some embodiments, the polymer portion of the lid portion 152 may be coupled with a polymer portion of the base portion 154.

In some embodiments, the IC assembly 100 may be disposed between the base portion 154 and the lid portion 152. In some embodiments, the IC assembly 100 may be coupled with the base portion 154 using any suitable technique including, for example, using an adhesive. The IC assembly may represent a wide variety of suitable IC devices including, for example, elements of a solid-state drive (SSD) in one embodiment. In some embodiments, the enclosure 150 and IC assembly 100 may represent a solid-state drive.

In some embodiments, the IC assembly 100 may include one or more dies (hereinafter "die 102") electrically and/or physically coupled with a package substrate 121. The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a processor, memory, SoC, or ASIC.

In some embodiments, an underfill material 108 (sometimes referred to as an "encapsulant") may be disposed between the die 102 and the package substrate 121 to promote adhesion and/or protect features of the die 102 and package substrate 121. The underfill material 108 may be composed of an electrically insulative material and may encapsulate at least a portion of the die 102 and/or die-level interconnect structures 106, as can be seen. In some embodiments, the underfill material 108 is in direct contact with the die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include transistor devices, and an inactive side, S2, may be disposed opposite to the active side S1, as can be seen.

The die 102 may generally include a semiconductor substrate 102$a$, one or more device layers (hereinafter "device layer 102$b$"), and one or more interconnect layers (hereinafter "interconnect layer 102$c$"). The semiconductor substrate 102$a$ may be substantially composed of a bulk semiconductor material such as, for example, silicon, in some embodiments. The device layer 102$b$ may represent a region where active devices such as transistor devices are formed on the semiconductor substrate 102$a$. The device layer 102$b$ may include, for example, structures such as channel bodies and/or source/drain regions of transistor devices. The interconnect layer 102$c$ may include interconnect structures that are configured to route electrical signals to or from the active devices in the device layer 102$b$. For example, the interconnect layer 102$c$ may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. For example, the PCB may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. The PCB may be composed of other suitable materials in other embodiments. The package substrate 121 may include other suitable types of substrates in other embodiments including, for example, substrates formed from glass, ceramic, or semiconductor materials.

The package substrate 121 may serve as an interposer to route electrical signals between the die 102 and other components such as, for example, passive devices (e.g., passive device 104) or other dies or components external to the IC assembly 100. The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias, or other interconnect structures to route electrical signals through the package substrate 121. For example, in some embodiments, the package substrate 121 may include electrical routing features such as pads (not shown) configured to receive the respective die-level interconnect structures 106 of the die 102.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 100 may be used in some embodiments.

In some embodiments, the enclosure 150 may have a rectangular profile, as can be seen. In some embodiments, the lid portion 152 and/or the base portion 154 may have a rectangular profile (e.g., when seen from a top or bottom view). The enclosure 150 may have other suitable profile shapes in other embodiments.

Figure 2:
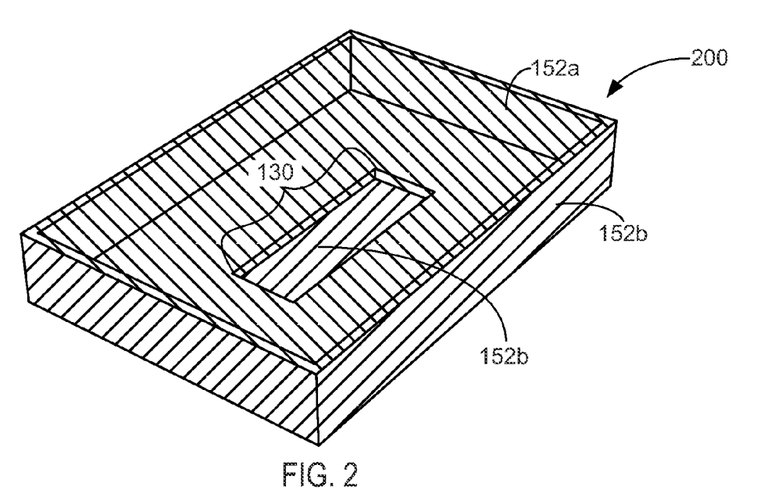
FIG. 2 schematically illustrates a perspective view of a molded lid structure, in accordance with some embodiments.

FIG. 2 schematically illustrates a perspective view of a molded lid structure 200, in accordance with some embodiments. The molded lid structure 200 may represent lid portion 152 of FIG. 1 and may comport with embodiments described in connection with lid portion 152 of FIG. 1. According to various embodiments, the molded lid structure 200 may include an interior portion 152$a$ and an exterior portion 152$b$. An opening 130 may be formed in the interior portion 152$a$ to allow thermal coupling of an IC assembly (e.g., IC assembly 100 of FIG. 1) with the exterior portion 152$b$ through the opening 130. The exterior portion 152$b$ may serve as a thermal conducting shell for the IC assembly when housed within the molded lid structure.

In some embodiments, the molded lid structure 200 may be formed by using a molding process such as, for example, an injection molding process. The interior portion 152$a$ may be formed by direct molding of a polymer on a metal of the exterior portion 152$b$. The combination of the polymer and metal may have a composite stiffness that is greater than cast magnesium in some embodiments. In some embodiments, the exterior portion 152$b$ may include multiple layers of metal. For example, the exterior portion 152$b$ may include a primary metal layer (e.g., aluminum) and a cladding layer (e.g., titanium or stainless steel) may be formed on the primary metal layer (e.g., by a diffusion bonding process). In some embodiments, the exterior portion 152$b$ may have a thickness that is between about 5% to 20% (e.g., 10%) of a total combined thickness of the exterior portion 152$b$ and the interior portion 152$a$. The exterior portion 152$b$ may have other suitable thicknesses in other embodiments.

According to various embodiments, the molded lid structure 200 may provide a higher stiffness and lower mass enclosure than current cast metal enclosures. The molded lid structure 200 may further facilitate thermal dissipation through the opening 130. Formation of the metal-polymer composite structure of the molded lid structure 200 by a molding process may provide substantial cost savings relative to metal casting processes to provide an enclosure of an IC assembly. Further, the molded lid structure 200 may allow components of the IC assembly to inset into the walls of the enclosure (e.g., opening 130 in the enclosure 150 of FIG. 1) formed by the molded lid structure 200, which may reduce a thickness (e.g., thickness T of FIG. 1) of the enclosure by ~0.5 millimeters or more relative to cast metal enclosures to provide an enclosure with reduced Z-height.

Additionally, the molded lid structure 200 may not require post cosmetic finishing relative to cast metal enclosures and allows, if desired, annodization of the exterior portion 152$b$ (e.g., after molding). The molded lid structure 200 may provide a superior thermal solution to an enclosure formed solely of polymer. The molding process may allow increased internal molded feature capability such as, for example, integration of features such as fastening mechanisms (e.g., one or more fastening mechanisms 156 of FIG. 1) including, for example, screwless mechanisms. The metal of the exterior portion 152b may be selected for a variety of mechanical, cosmetic and/or cost considerations such as, for example, aluminum, titanium, clad, etc. Further, the molded lid structure 200 may provide an enclosure with a higher beat rate (e.g., cycle time) relative to an enclosure such as a machined or cast chassis with machined secondary features and secondary cosmetic finishing.

Figure 3:
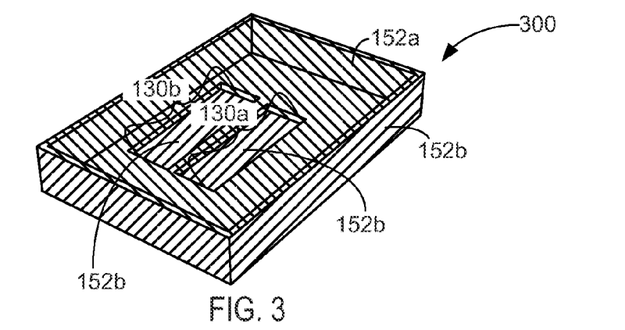
FIG. 3 schematically illustrates a perspective view of a molded lid structure having multiple openings formed in an interior portion, in accordance with some embodiments.

FIG. 3 schematically illustrates a perspective view of a molded lid structure 300 having multiple openings 130a, 130b formed in an interior portion 152a, in accordance with some embodiments. The molded lid structure 300 may comport with embodiments described in connection with the molded lid structure 200 of FIG. 2. In some embodiments, multiple openings 130a, 130b may be formed through the interior portion 152a to allow other heat-generating elements of an IC assembly (e.g., IC assembly 100 of FIG. 1) to be thermally coupled with the exterior portion 152b through respective openings of the multiple openings 130a, 130b. The openings 130a, 130b may have other suitable shapes than depicted in other embodiments.

Figure 4:
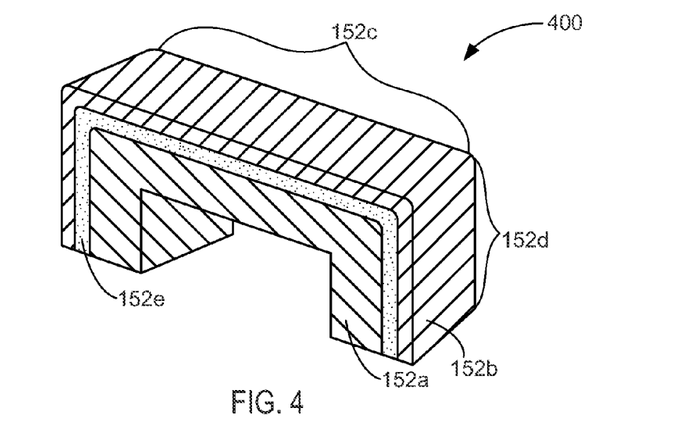
FIG. 4 schematically illustrates a cross-section perspective view of a portion of a molded lid structure, in accordance with some embodiments.

FIG. 4 schematically illustrates a cross-section perspective view of a portion 400 of a molded lid structure (e.g., molded lid structure 200 or 300 of FIG. 2 or 3), in accordance with some embodiments. According to various embodiments, a primer material 152e may be disposed between an interior portion 152a and an exterior portion 152b of the molded lid structure.

In some embodiments, the primer material 152e may include a polymer primer system such as, for example, an epoxy. The polymer primer system may include other suitable thermosets and/or thermoplastics, which may have a different material composition than the polymer of the interior portion 152a, in some embodiments. In other embodiments, the primer material 152e may include a nano-structured metal oxide such as, for example, aluminum oxide including porous aluminum oxide. The polymer of the interior portion 152a may fill holes in the nano-structured oxide to increase adhesion. The primer material 152e may include other suitable materials in other embodiments.

Figure 5:
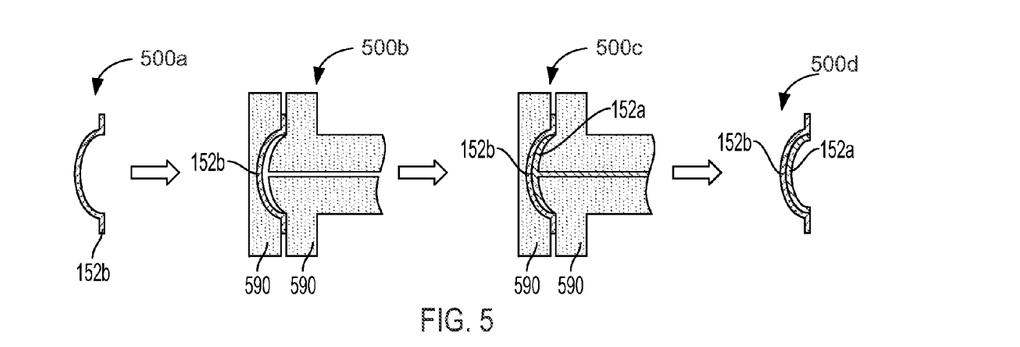
FIG. 5 schematically illustrates a lid structure during various stages of fabrication according to a first technique, in accordance with some embodiments.

FIG. 5 schematically illustrates a lid structure (e.g., molded lid structure 200 or 300 of FIG. 2 or 3) during various stages of fabrication according to a first technique, in accordance with some embodiments. At 500a, an exterior portion 152b comprising a metal is depicted subsequent to shaping the metal in a shape of the lid structure. The exterior portion 152b may be shaped, for example, by punching and forming a foil of the metal to a desired shape.

At 500b, the exterior portion 152b is depicted subsequent to placing the shaped metal into a mold 590. The mold 590 may clamp to hold the exterior portion 152b in place during an injection molding process. In some embodiments, the clamp mechanism may be configured to allow the metal to slip during deposition of the polymer to limit strain on the metal.

At 500c, the exterior portion 152b is depicted subsequent to depositing polymer of an interior portion 152a on the exterior portion 152b using an injection molding process. In some embodiments, one or more openings (e.g., opening 130 of FIG. 2) may be formed in the interior portion 152a by clamping one or more mold blocks against the exterior portion 152b during the injection molding process in an area where the respective one or more openings are desired.

In some embodiments, a primer material (not shown) may be deposited on a surface of the exterior portion 152b prior to depositing polymer of the interior portion 152a on the exterior portion 152b to promote adhesion of the polymer to metal of the exterior portion 152b.

At 500d, a lid structure is depicted subsequent to removing the lid structure from the mold 590. Subsequent to removing the lid structure from the mold 590, the lid structure may be deflashed, cleaned and/or anodized in some embodiments.

Figure 6:
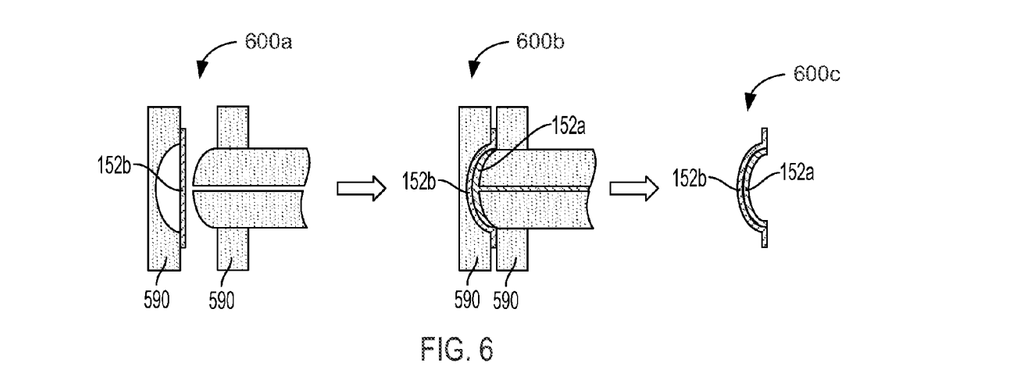
FIG. 6 schematically illustrates a lid structure during various stages of fabrication according to a second technique, in accordance with some embodiments.

FIG. 6 schematically illustrates a lid enclosure (e.g., molded lid structure 200 or 300 of FIG. 2 or 3) during various stages of fabrication according to a second technique, in accordance with some embodiments. At 600a, an exterior portion 152b comprising a metal is depicted subsequent to placing a metal film in a mold 590. The metal film may not be shaped in the form of the lid structure in some embodiments. For example, in some embodiments, the metal film may be substantially flat or some other shape.

At 600b, the exterior portion 152b is depicted subsequent to simultaneously shaping the metal to provide the exterior portion 152b in the form of the lid structure and depositing the polymer on the metal using an injection mold process to provide an interior portion 152a. For example, the metal film may be clamped in the mold and polymer may be injected at high pressure, which may cause the metal shape to be molded into a pre-existing shape of the mold 590, as can be seen.

In some embodiments, one or more openings (e.g., opening 130 of FIG. 2) may be formed in the interior portion 152a by clamping one or more floating mold blocks against the exterior portion 152b during the injection molding process in an area where the respective one or more openings are desired. The floating mold blocks may follow the metal film from the initial position at 600a to the shaped position at 600b.

In some embodiments, a primer material (not shown) may be deposited on a surface of the exterior portion 152b prior to depositing polymer of the interior portion 152a on the exterior portion 152b to promote adhesion of the polymer to metal of the exterior portion 152b.

At 600c, a lid structure is depicted subsequent to removing the lid structure from the mold 590.

Figure 7:
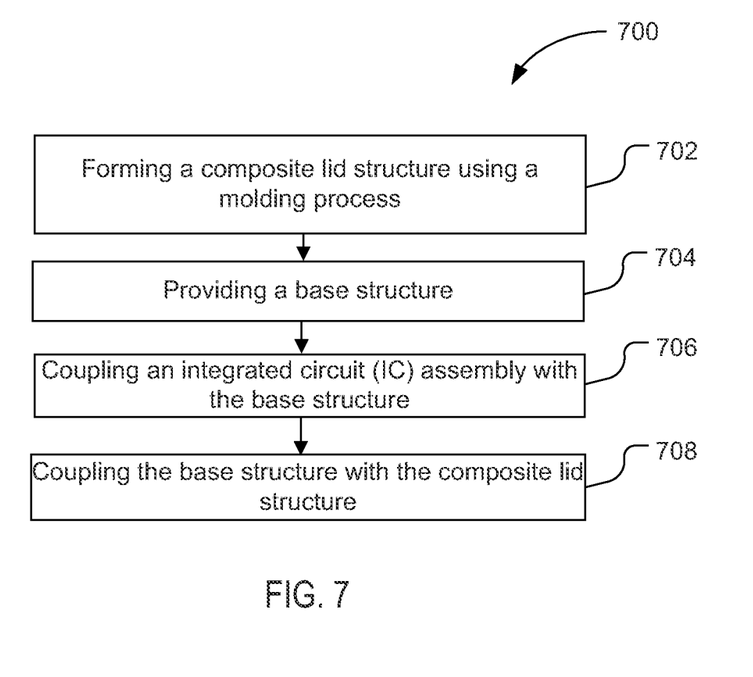
FIG. 7 schematically illustrates a flow diagram for a method of fabricating an enclosure for an IC assembly, in accordance with some embodiments.

FIG. 7 schematically illustrates a flow diagram for a method 700 of fabricating an enclosure (e.g., enclosure 150 of FIG. 1) for an IC assembly (e.g., IC assembly 100 of FIG. 1), in accordance with some embodiments. The method 700 may comport with techniques described in connection with FIGS. 1-6 and vice versa.

At 702, the method 700 may include forming a composite lid structure (e.g., molded lid structure 200 or 300 of FIG. 2 or 3) using a molding process. According to various embodiments, the composite lid structure may be formed according to techniques described in connection with FIG. 5 or 6. For example, forming the composite lid structure may include shaping a metal to provide an exterior (e.g., exterior portion 152b of FIG. 5) of a body portion (e.g., body portion 152c of FIG. 1) and side portion (e.g., side portion 152d of FIG. 1) of the composite lid structure and depositing polymer on the metal to provide an interior (e.g., interior portion 152a of FIG. 5) of the body portion and the side portion.

In some embodiments, shaping the metal and depositing the polymer may be simultaneously performed during an injection molding process. For example, depositing the polymer may shape the metal to provide the exterior of the body portion and the side portion (e.g., as described in connection with FIG. 6).

Forming the composite lid structure may further include forming one or more openings (e.g., openings 130a, 130b of FIG. 3) in the body portion such that the IC assembly can be thermally coupled with the exterior portion through the opening. For example, the one or more openings may be formed using mold insert blocks to prevent polymer from being deposited on the metal in an area where the one or more openings are to be formed when depositing the polymer on the metal.

In some embodiments, forming the composite lid structure may further include providing a primer material (e.g., primer material 152e of FIG. 4) on the metal prior to depositing the polymer to promote adhesion between the polymer and the metal. In some embodiments, forming the composite lid structure may further include forming elements of a fastening mechanism (e.g., one or more fastening mechanisms 156 of FIG. 1) configured to couple with or mate with corresponding elements of the fastening mechanism on a base structure.

At 704, the method 700 may include providing a base structure (e.g., base portion 154 of FIG. 1). In some embodiments, providing the base structure may include forming the base structure according to any suitable technique. The base structure may include, for example, any suitable material structure that is configured to couple with the composite lid structure to house the IC assembly. In some embodiments, the base structure may include elements of a fastening mechanism (e.g., one or more fastening mechanisms 156 of FIG. 1) configured to couple with or mate with corresponding elements of the fastening mechanism on the composite lid structure.

At 706, the method 700 may include coupling the IC assembly with the base structure. Any suitable technique may be used to couple the IC assembly with the base structure including, for example, an adhesive, mechanical fasteners or otherwise placing the IC assembly relative to the base structure such that when the composite lid structure and base structure are coupled together, the IC assembly is housed within the cavity (e.g., cavity 133 of FIG. 1) between the composite lid structure and the base structure.

At 708, the method 700 may include coupling the base structure with the composite lid structure. The base structure may be coupled with the composite lid structure using any suitable technique, including for example, using integrated fastening mechanisms, which may be formed as part of the molding process at 702. In some embodiments, coupling the base structure with the composite lid structure may include permanently affixing the base structure with the lid structure using snap fasteners.

In some embodiments, the base structure is coupled with the lid structure such that the IC assembly is thermally coupled with the exterior portion through the one or more openings formed in the interior portion. For example, the IC assembly may be thermally coupled with the exterior portion using a thermal adhesive or any other suitable technique. Various operations are described as multiple discrete operations in turn, in a manner that is most helpful in understanding the claimed subject matter. However, the order of description should not be construed as to imply that these operations are necessarily order dependent. For example, in some embodiments, actions at 704 and 706 may be performed before, after or simultaneously with actions described in connection with 702. The method 700 may include other suitable variations of order.

Figure 8:
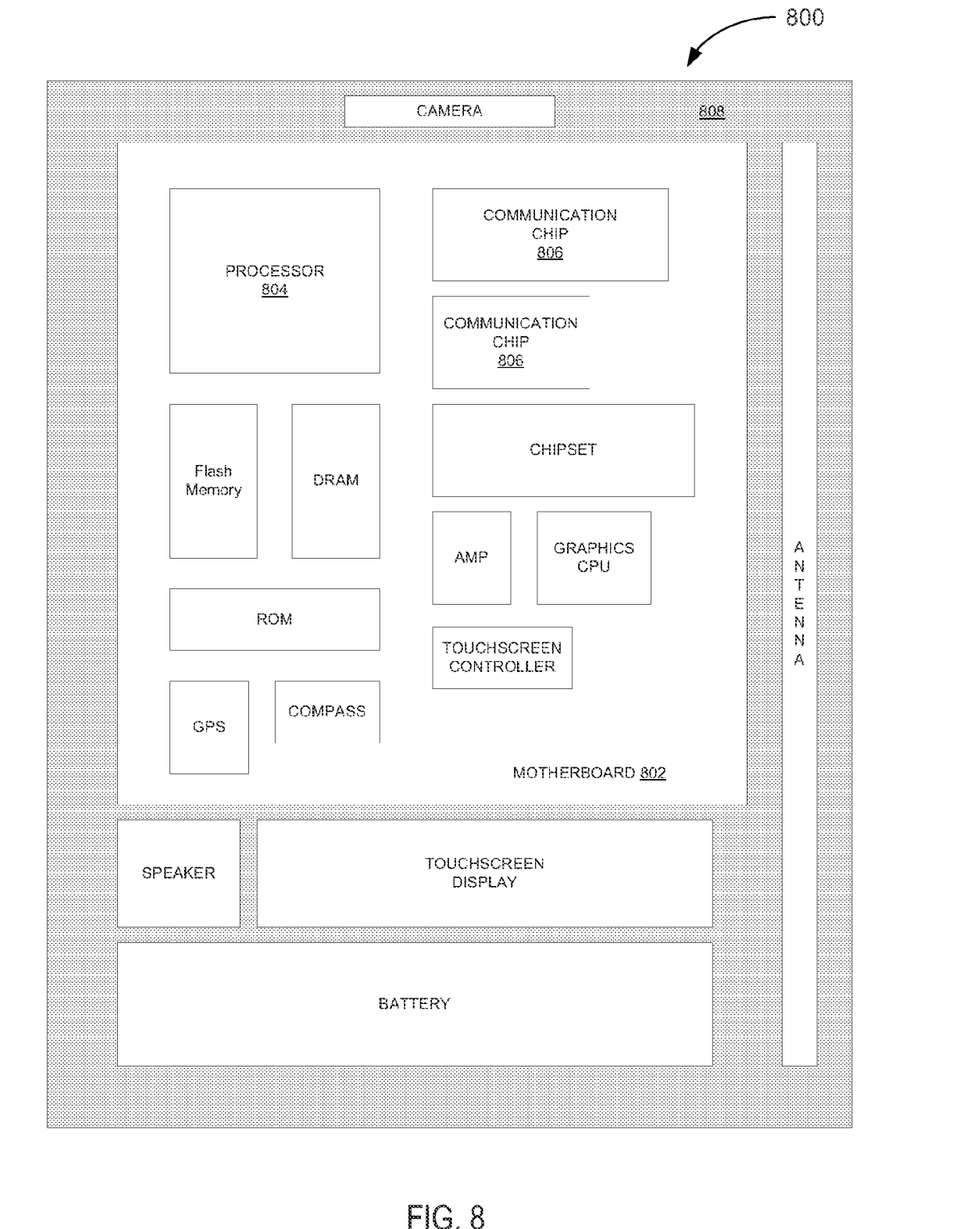
FIG. 8 schematically illustrates a computing device that includes an enclosure for an IC assembly as described herein, in accordance with some embodiments.

Embodiments of the present disclosure may be implemented into a system using any suitable hardware and/or software to configure as desired. FIG. 8 schematically illustrates a computing device 800 that includes an enclosure (e.g., enclosure 150 of FIG. 1) for an IC assembly (e.g., IC assembly 100 of FIG. 1) as described herein, in accordance with some embodiments. The computing device 800 may house a board such as motherboard 802 (e.g., in housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804. The term "processor" may refer to any device or portion of a device that processes electronic data from registers and/or memory to transform that electronic data into other electronic data that may be stored in registers and/or memory.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

In some embodiments, memory such as flash memory or DRAM of the computing device may be components of an IC assembly housed in an enclosure (e.g., enclosure 150 of FIG. 1) as described herein. In other embodiments, other heat-generating devices (e.g., processor 804, communication chip 806) of the computing device may be components of an IC assembly housed in an enclosure (e.g., enclosure 150 of FIG. 1) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

EXAMPLES

According to various embodiments, the present disclosure describes an enclosure for an integrated circuit (IC) assembly. Example 1 of the enclosure includes a molded lid structure having a body portion, and a side portion that extends from the body portion and forms a cavity configured to house the IC assembly, wherein the body portion and the side portion share a contiguous interior material comprising a polymer and share a contiguous exterior material comprising a metal, the contiguous interior material having an opening formed in the body portion such that the IC assembly can be thermally coupled with the contiguous exterior material through the opening. Example 2 may include the enclosure of Example 1, wherein the IC assembly includes heat-generating elements of a solid-state drive (SSD). Example 3 may include the enclosure of Example 1, wherein the opening is one of multiple openings formed in the body portion such that the IC assembly can be thermally coupled with the contiguous exterior material through the multiple openings. Example 4 may include the enclosure of Example 1, wherein the polymer is selected from a group consisting of ABS (Acrylonitrile Butadiene Styrene), ABS+PC (ABS+Polycarbonate), Acetal (POM), Acrylic (PMMA), LCP (Liquid Crystal Polymer), PA-Nylon 6 (Polyamide), PA-Nylon 6/6 (Polyamide), PA-Nylon 11 (Polyamide), PBT (Polybutylene Terepthalate), PC (Polycarbonate), PEI (Polyetherimide), PE (Polyethylene), LDPE (Low Density Polyethylene), HDPE (High Density Polyethylene), PET (Polyethylene Terepthalate), PP (Polypropylene), PPA (Polyphthalamide), PPS (Polyphenylene Sulfide), PS (Polystyrene), HIPS (High Impact Polystyrene), PSU (Polysulfone), PU (Polyurethane), PVC (Polyvinylchloride), PVDF (Polyvinylidene Fluoride), SAN (Styrene Acrylonitrile), TPE (Thermoplastic Elastomer) and TPU (Thermoplastic Polyurethane). Example 5 may include the enclosure of Example 1, wherein the metal is selected from a group consisting of aluminum (Al), iron (Fe), titanium (Ti), copper (Cu), nickel (Ni), magnesium (Mg), stainless steel and Inconel. Example 6 may include the enclosure of any of Examples 1-5, further comprising a primer material disposed between the contiguous interior material and the contiguous exterior material to promote adhesion between the contiguous interior material and the contiguous exterior material. Example 7 may include the enclosure of Example 6, wherein the primer material comprises a polymer or nano-structured metal oxide. Example 8 may include the enclosure of any of Examples 1-5, further comprising a base structure configured to couple with the molded lid structure such that the cavity is disposed between the base structure and the molded lid structure when the base structure is coupled with the molded lid structure. Example 9 may include the enclosure of any of Examples 1-5, wherein the molded lid structure has a rectangular profile.

According to various embodiments, the present disclosure describes a method of fabricating an enclosure for an integrated circuit (IC) assembly. Example 10 of the method may include forming a lid structure using a molding process, the lid structure having a body portion, and a side portion that extends from the body portion and forms a cavity configured to house the IC assembly, wherein the body portion and the side portion share a contiguous interior material comprising a polymer and share a contiguous exterior material comprising a metal, wherein forming the lid structure comprises forming an opening in the body portion such that the IC assembly can be thermally coupled with the contiguous exterior material through the opening. Example 11 may include the method of Example 10, wherein forming the lid structure comprises shaping the metal to provide an exterior of the body portion and the side portion and depositing the polymer on the metal using the molding process to provide an interior of the body portion and the side portion, wherein the molding process is an injection molding process. Example 12 may include the method of Example 11, wherein shaping the metal and depositing the polymer are simultaneously performed during the injection molding process. Example 13 may include the method of Example 12, wherein depositing the polymer shapes the metal to provide the exterior of the body portion and the side portion. Example 14 may include the method of Example 11, wherein forming the opening in the body portion comprises using mold insert blocks to prevent the polymer from being deposited on the metal in an area where the opening is to be formed when depositing the polymer on the metal. Example 15 may include the method of Example 11, wherein forming the lid structure further comprises providing a primer material on the metal prior to depositing the polymer to promote adhesion between the polymer and the metal. Example 16 may include the method of any of Examples 10-15, further comprising providing a base structure, coupling the IC assembly with the base structure and coupling the base structure with the lid structure such that the IC assembly is thermally coupled with the contiguous exterior material through the opening. Example 17 may include the method of Example 16, wherein coupling the base structure with the lid structure comprises permanently affixing the base structure with the lid structure using snap fasteners.

According to various embodiments, the present disclosure describes a sold-state drive (SSD). Example 18 of the SSD may include a molded lid structure having a body portion, and a side portion that extends from the body portion and forms a cavity configured to house an integrated circuit (IC) assembly, wherein the body portion and the side portion share a contiguous interior material comprising a polymer and share a contiguous exterior material comprising a metal, the contiguous interior material having an opening formed in the body portion, a base structure coupled with the molded lid structure such that the cavity is disposed between the base structure and the molded lid structure and the IC assembly, the IC assembly being disposed between the base structure and the molded lid structure, wherein the IC assembly is thermally coupled with the contiguous exterior material of the molded lid structure through the opening. Example 19 may include the SSD of Example 18, wherein the opening is one of multiple openings formed in the body portion and the IC assembly is thermally coupled with the contiguous exterior material through the multiple openings. Example 20 may include the SSD of any of Examples 18-19, further comprising a primer material disposed between the contiguous interior material and the contiguous exterior material to promote adhesion between the contiguous interior material and the contiguous exterior material.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim1nterpretation.

What is claimed is:

1. An enclosure for an integrated circuit (IC) assembly, the enclosure comprising:
a composite lid structure having
a body portion, and
a side portion that extends from the body portion and forms a cavity configured to house the IC assembly, wherein the body portion and the side portion share a contiguous interior material comprising a polymer and share a contiguous exterior material comprising a metal, the contiguous interior material having an opening formed in the body portion such that the IC assembly is thermally coupled with the contiguous exterior material through the opening.

2. The enclosure of claim 1, wherein the IC assembly includes heat-generating elements of a solid-state drive (SSD).

3. The enclosure of claim 1, wherein the opening is one of multiple openings formed in the body portion such that the IC assembly can be thermally coupled with the contiguous exterior material through the multiple openings.

4. The enclosure of claim 1, wherein the polymer is selected from a group consisting of ABS (Acrylonitrile Butadiene Styrene), ABS +PC (ABS +Polycarbonate), Acetal (POM), Acrylic (PMMA), LCP (Liquid Crystal Polymer), PA-Nylon 6 (Polyamide), PA-Nylon 6/6 (Polyamide), PA-Nylon 11 (Polyamide), PBT (Polybutylene Terepthalate), PC (Polycarbonate), PEI (Polyetherimide), PE (Polyethylene), LDPE (Low Density Polyethylene), HDPE (High Density Polyethylene), PET (Polyethylene Terepthalate), PP (Polypropylene), PPA (Polyphthalamide), PPS (Polyphenylene Sulfide), PS (Polystyrene), HIPS (High Impact Polystyrene), PSU (Polysulfone), PU (Polyurethane), PVC (Polyvinylchloride), PVDF (Polyvinylidene Fluoride), SAN (Styrene Acrylonitrile), TPE (Thermoplastic Elastomer) and TPU (Thermoplastic Polyurethane).

5. The enclosure of claim 1, wherein the metal is selected from a group consisting of aluminum (Al), iron (Fe), titanium (Ti), copper (Cu), nickel (Ni), magnesium (Mg), stainless steel and Inconel.

6. The enclosure of claim 1, further comprising:
a primer material disposed between the contiguous interior material and the contiguous exterior material to promote adhesion between the contiguous interior material and the contiguous exterior material.

7. The enclosure of claim 6, wherein the primer material comprises a polymer or nano-structured metal oxide.

8. The enclosure of claim 1, further comprising:
a base structure configured to couple with the molded lid structure such that the cavity is disposed between the base structure and the molded lid structure when the base structure is coupled with the molded lid structure.

9. The enclosure of claim 1, wherein the molded lid structure has a rectangular profile.

10. A solid-state drive (SSD) comprising:
a composite lid structure having
a body portion, and
a side portion that extends from the body portion and forms a cavity configured to house an integrated circuit (IC) assembly, wherein the body portion and the side portion share a contiguous interior material comprising a polymer and share a contiguous exterior material comprising a metal, the contiguous interior material having an opening formed in the body portion;
a base structure coupled with the molded lid structure such that the cavity is disposed between the base structure and the molded lid structure; and
the IC assembly being disposed between the base structure and the molded lid structure, wherein the IC assembly is thermally coupled with the contiguous exterior material of the molded lid structure through the opening.

11. The SSD of claim 10, wherein:
the opening is one of multiple openings formed in the body portion; and
the IC assembly is thermally coupled with the contiguous exterior material through the multiple openings.

12. The SSD of claim 10, further comprising:
a primer material disposed between the contiguous interior material and the contiguous exterior material to promote adhesion between the contiguous interior material and the contiguous exterior material.

* * * * *